(12) United States Patent
Windisch et al.

(10) Patent No.: US 8,115,219 B2
(45) Date of Patent: Feb. 14, 2012

(54) LED SEMICONDUCTOR BODY AND USE OF AN LED SEMICONDUCTOR BODY

(75) Inventors: Reiner Windisch, Pettendorf (DE); Ralph Wirth, Mintraching-Auhof (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 239 days.

(21) Appl. No.: 12/443,338

(22) PCT Filed: Aug. 28, 2007

(86) PCT No.: PCT/DE2007/001536
§ 371 (c)(1),
(2), (4) Date: May 5, 2009

(87) PCT Pub. No.: WO2008/040274
PCT Pub. Date: Apr. 10, 2008

(65) Prior Publication Data
US 2010/0019259 A1    Jan. 28, 2010

(30) Foreign Application Priority Data
Sep. 28, 2006 (DE) .......................... 10 2006 046 037

(51) Int. Cl.
*H01L 33/00* (2010.01)
(52) U.S. Cl. ................................. 257/97; 257/E33.064

(58) Field of Classification Search .................... 257/97, 257/E33.064
See application file for complete search history.

(56) References Cited

U.S. PATENT DOCUMENTS

| | | | |
|---|---|---|---|
| 5,955,749 A | 9/1999 | Joannopoulos et al. | |
| 6,815,725 B2* | 11/2004 | Sugawara et al. | 257/89 |
| 7,442,964 B2* | 10/2008 | Wierer et al. | 257/98 |
| 2005/0067627 A1* | 3/2005 | Shen et al. | 257/89 |
| 2006/0006402 A1 | 1/2006 | Hsieh et al. | |
| 2006/0027815 A1 | 2/2006 | Wierer, Jr. et al. | |
| 2006/0097269 A1 | 5/2006 | Lester | |
| 2006/0163606 A1 | 7/2006 | Wierer, Jr. et al. | |
| 2006/0202226 A1 | 9/2006 | Weisbuch et al. | |

FOREIGN PATENT DOCUMENTS

| | | |
|---|---|---|
| DE | 10 2005 031 612 A1 | 2/2006 |
| EP | 1 403 935 A2 | 3/2004 |
| EP | 1 526 583 A2 | 4/2005 |
| WO | WO 2006/047039 A1 | 5/2006 |

OTHER PUBLICATIONS

Schnitzer, I., et al., "30% External Quantun Efficiency from Surface Textured, Thin-film Light-emitting Diodes," Applied Physics Letters 63, Oct. 18, 1993, pp. 2174-2176, American Institute of Physics.

* cited by examiner

*Primary Examiner* — Lex Malsawma
(74) *Attorney, Agent, or Firm* — Slater & Matsil, L.L.P.

(57) ABSTRACT

An LED semiconductor body includes at least one first radiation-generating active layer and at least one second radiation-generating active layer, wherein the LED semiconductor body has a photonic crystal.

31 Claims, 1 Drawing Sheet

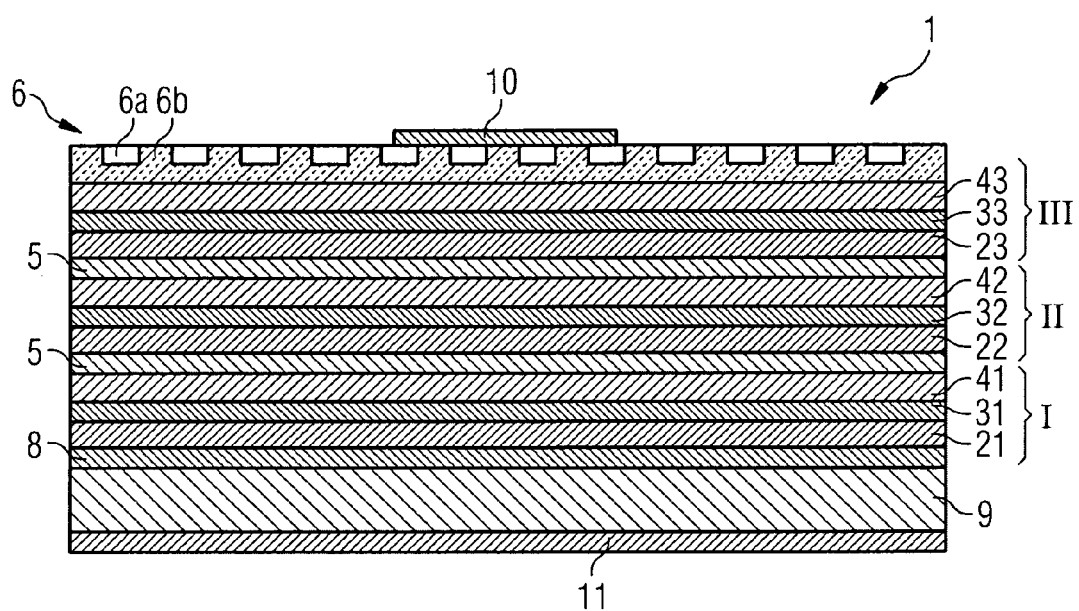

LED SEMICONDUCTOR BODY AND USE OF AN LED SEMICONDUCTOR BODY

This patent application claims the priority of German Patent Application 10 2006 046 037.5 filed Sep. 28, 2006, the disclosure content of which is hereby incorporated by reference.

TECHNICAL FIELD

The present invention relates to an LED semiconductor body and to uses of an LED semiconductor body.

BACKGROUND

Radiation sources having a high luminance are required for projection applications. Furthermore, an emission angle of $\leq 30°$ is desired since optical systems generally have a numerical aperture $\leq 0.5$ and an irradiation within this emission angle can thus be used.

I. Schnitzer et al., Appl. Phys. Lett. 63(16), Oct. 18, 1993, 2174-2176 describes the basic principle of a thin-film light-emitting diode chip. A thin-film light-emitting diode chip is to a good approximation a Lambertian surface emitter. Although a thin-film light-emitting diode chip is suitable for projection applications on account of the emission characteristic, conventional thin-film light-emitting diode chips usually have a layer structure having an active layer whose amount of radiation is limited by the current intensity. This is because the current density in the active layer should not exceed a maximum current density since otherwise there is the risk of excessive aging effects disadvantageously shortening the lifetime of the LED semiconductor body.

SUMMARY

In a first aspect, the present invention specifies an LED semiconductor body having an increased luminance.

In a further aspect, the present invention specifies uses of an LED semiconductor body having an increased luminance.

An LED semiconductor body according to the invention comprises at least one first radiation-generating active layer and at least one second radiation-generating active layer and furthermore has a photonic crystal.

An active layer should be understood in the present case to mean a radiation-generating pn-junction. In the simplest case, this pn-junction can be formed by means of a p-conducting and an n-conducting semiconductor layer which directly adjoin one another. Preferably, the actual radiation-generating layer for instance in the form of a doped or undoped quantum layer, is formed between the p-conducting and the n-conducting active layer. The quantum layer can be shaped as a single quantum well (SQW) structure or multiple quantum well (MQW) structure or else as a quantum wire or quantum dot structure.

In conventional LED semiconductor bodies, on account of a relatively large difference in refractive index between the semiconductor material of the semiconductor body and the surrounding medium, for example air, total reflection can occur starting from a specific critical angle, which results in a considerably lower proportion of coupled-out radiation.

Advantageously, the radiation losses caused by total reflection can be reduced by means of the photonic crystal.

A light beam coming from the semiconductor body is subjected to total reflection at the interface between the optically denser semiconductor material having a refractive index n1 and the surrounding optically less dense medium, for example air, having a refractive index n2 when it impinges on the interface at an angle which is greater than or equal to the critical angle θ of total reflection, where the following holds true:

$\sin(\theta) = n2/n1$.

The angle indications here relate to the normal to the interface at the point of impingement of the light beam.

The photonic crystal provided for the LED semiconductor body can advantageously have the effect that a part of the radiation which impinges on the photonic crystal at an angle of greater than or equal to the critical angle θ is deflected in such a way that it impinges on a radiation coupling-out area at an angle of less than the critical angle θ and can thus couple out.

Furthermore, the original emission angle can be constricted by means of the photonic crystal.

Preferably, the photonic crystal comprises a plurality of first regions having a first refractive index and a plurality of second regions having a second refractive index. Particularly preferably, the regions are arranged regularly. The regular arrangement can correspond to a one-dimensional, two-dimensional or three-dimensional lattice. In particular, the photonic crystal in the context of the invention can have the structure of a two-dimensional lattice. In this case, the distance between two adjacent first regions or two adjacent second regions corresponds to the lattice constant. The photonic crystal achieves its effect best if the lattice constant is adapted to a wavelength of the radiation generated by the semiconductor body. Preferably, the distance between two adjacent first regions and/or two adjacent second regions corresponds approximately to the wavelength of the radiation generated by the LED semiconductor body. Particularly preferably, the distance lies between $10^{-9}$ m and $10^{-6}$ m.

In accordance with one preferred variant, the second regions are connected. That is to say that in each case two second regions have, in particular, more than one contact point, for example a contact area. In this case, the contact point and the contact area should not be understood to mean physical constituent parts, but rather emerge on account of an imaginary subdivision of the photonic crystal into "crystal cells" of identical construction.

The photonic crystal typically contains a dielectric material. According to the invention, the first regions are particularly preferably filled or unfilled depressions in a semiconductor layer of the LED semiconductor body. The first regions can be inserted as depressions in a periodic arrangement into the semiconductor layer. As an alternative, it is possible to arrange the first regions in lattice-like fashion, wherein they are formed in insular fashion and separated from one another by suitable interspaces, for example by a continuous depression. The second possibility thus constitutes the inversion of the first possibility by the regions and the depressions being interchanged relative to one another. In both cases, the depressions and respectively interspaces can advantageously be filled with a filling material, for example a dielectric or some other semiconductor material, the refractive index of which differs from the refractive index of the first region. In particular, the first regions have a width and/or depth of between 100 nm and 500 nm.

In accordance with one preferred configuration, the first and the second active layer are arranged one above the other in a vertical direction. Advantageously, in the case of an LED semiconductor body having active layers arranged one above the other, in comparison with conventional LED semiconductor bodies of the type mentioned in the introduction, two or else more active layers are available simultaneously for generating radiation such that the amount of radiation generated overall or the luminance is advantageously increased. The luminance is the optical power per emission area of the semiconductor body and solid angle element.

The first and the second active layer preferably generate radiation having the same wavelength. This is advantageous particularly in combination with a reflection layer which, as described below, is provided for reflection of the radiation generated by the active layers. This is because in contrast to active layers that generate radiation having different wavelengths, in this case the absorption of reflected radiation by the respective other active layer does not have a disadvantageous effect on the total radiation emitted.

Furthermore, the first and the second active layer can be monolithically integrated in the semiconductor body. This obviates the production step of connecting the first layer stack to the second layer stack, for example by means of bonding.

The LED semiconductor body is expediently arranged on a carrier element. An electrically conductive carrier element is preferably used for this purpose. This makes it possible to form a vertically conductive component in which the current flow runs essentially in a vertical direction. Components of this type are distinguished by a comparatively homogeneous current distribution within the LED semiconductor body. For contact-connection, a rear side contact is expediently arranged on a side of the conductive carrier element that is remote from the LED semiconductor body.

The carrier element is preferably different from a growth substrate for the LED semiconductor body. Particularly preferably, the growth substrate is removed from the semiconductor body. The semiconductor body is a thin-film semiconductor body, in particular.

A thin-film semiconductor body is distinguished in particular by at least one of the following characteristic features:
- a reflection layer is applied or formed at a first main area—facing toward a carrier element—of a radiation-generating epitaxial layer sequence, said reflection layer reflecting at least part of the electromagnetic radiation generated in the epitaxial layer sequence back into the latter;
- the epitaxial layer sequence has a thickness in the region of 20 μm or less, in particular in the region of 10 μm; and
- the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior.

A basic principle of a thin-film light-emitting diode chip is described for example in I. Schnitzer et al., Appl. Phys. Lett. 63 (16), Oct. 18, 1993, 2174-2176, the disclosure content of which in this respect is hereby incorporated by reference.

A thin-film light-emitting diode chip is to a good approximation a Lambertian surface emitter and is suitable in particular for headlight and projection applications.

In the case of the LED semiconductor body formed as a thin-film semiconductor body, the intensity of radiation coupled out per luminous area is advantageously increased particularly within a narrow emission angle.

Depending on the material system, the growth substrate can be removed mechanically, thermally or by means of a laser lift-off method. Thin-film semiconductor bodies are distinguished by an advantageous low forward voltage and a high efficiency when generating radiation. Furthermore, with regard to the choice of carrier element, thin-film semiconductor bodies are not limited by the boundary conditions required for epitaxy, such that the carrier elements can be optimized for example with regard to their thermal conductivity or else their costs.

In accordance with one preferred configuration, there is arranged between the LED semiconductor body and the carrier element a reflection layer for reflecting the radiation generated in the LED semiconductor body in a direction of the photonic crystal. The luminance can advantageously be additionally increased thereby.

In the case of an LED semiconductor body according to the invention, the reflection layer preferably contains a metal. The reflection layer particularly preferably contains at least one of the materials Au, Al, Zn and Ag. The reflection layer can be embodied as a metallic layer or a composite of a metallic layer and a TCO (Transparent Conductive Oxide) layer, wherein the TCO layer can contain for example indium oxide, tin oxide, indium tin oxide (ITO) or zinc oxide. Furthermore, the reflection layer can be embodied as a composite of a metallic layer and a structured layer, wherein the structured layer contains in particular an electrically insulating material, for example a silicon nitride or a silicon oxide, and has in particular openings that are preferably filled with the material of the metallic layer. In the case of the variants mentioned, the reflection layer furthermore has a sufficient electrical conductivity, such that a current can flow through the reflection layer.

In accordance with one embodiment, the photonic crystal is arranged on a side of the LED semiconductor body which is remote from the carrier element. The photonic crystal can perform an electrical function alongside the optical function and can be constituted in such a way that it serves for current spreading.

In accordance with an alternative embodiment, the photonic crystal is arranged between the reflection layer and the LED semiconductor body. In this case, too, the photonic crystal can contribute to improvement of the electrical properties in the LED semiconductor body.

In one preferred configuration of the LED semiconductor body, a tunnel junction is formed between the first and the second active layer. Said tunnel junction serves as an electrical connection between the first and second active layers. By way of example, such a tunnel junction can be formed by means of a highly doped layer of a first conductivity type and a highly doped layer of a second conductivity type. Particularly preferably, the first and the second active layer are arranged in the same sense, such that their pn-junctions thus form a pn-pn or np-np structure, wherein the pn-junctions are electrically connected in series by means of the intervening tunnel junction. In the context of the present invention, it is also possible in a similar manner for three or more active layers to be arranged vertically one above another in an LED semiconductor body, which layers are connected in a corresponding manner by a respective tunnel junction formed between two adjacent active layers.

In an alternative variant, the pn-junctions of the first and the second active layer are formed in opposite senses with respect to one another, such that a pn-np or np-pn structure thus arises. In this case, the active layers can be connected up in parallel.

The LED semiconductor body, preferably one of the two active layers or both active layers, can contain a phosphide-based compound semiconductor material. The compound semiconductor material has, in particular, the composition $Al_nGa_mIn_{1-n-m}P$, where $0 \leq n \leq 1$, $0 \leq m \leq 1$ and $n+m \leq 1$.

As an alternative, the LED semiconductor body, preferably one of the two active layers or both active layers, can contain an arsenide-based compound semiconductor material. The compound semiconductor material has, in particular, the composition $Al_nGa_mIn_{1-n-m}As$, where $0 \leq n \leq 1$, $0 \leq m \leq 1$ and $n+m \leq 1$.

In accordance with a further possibility, the LED semiconductor body, preferably one of the two active layers or both active layers, can contain a nitride-based compound semiconductor material. The compound semiconductor material has, in particular, the composition $Al_nGa_mIn_{1-n-m}N$, where $0 \leq n \leq 1$, $0 \leq m \leq 1$ and $n+m \leq 1$.

The LED semiconductor body emits radiation preferably in a vertical direction.

In the LED semiconductor body according to the invention, an emission angle $\alpha \leq 30°$ can be obtained. The LED semiconductor body having such a narrow emission angle is suitable in particular for projection applications.

The LED semiconductor body according to the invention is preferably used as a radiation source in a radiation-emitting component. Both the radiation-emitting component and the LED semiconductor body are particularly suitable for projection applications.

BRIEF DESCRIPTION OF THE DRAWINGS

Further features, advantages and expediences of the invention will become apparent from the exemplary embodiment described below in conjunction with the FIGURE.

The FIGURE shows a schematic sectional view of an exemplary embodiment of an LED semiconductor body according to the invention.

DETAILED DESCRIPTION

The LED semiconductor body 1 illustrated in the FIGURE has three radiation-generating active layers 31, 32 and 33 arranged one above another in a vertical direction, that is to say perpendicular to a main extension direction of the active layers 31, 32 and 33. The active layers 31, 32 and 33 respectively belong to a layer stack I, II and III. The layer stacks I, II and III furthermore have respectively a layer 21, 22, 23 of a first conductivity type and a layer 41, 42, 43 of a second conductivity type. The active layers 31, 32 and 33 are typically arranged respectively between the layer 21, 22, 23 of the first conductivity type and the layer 41, 42, 43 of the second conductivity type.

The layer stacks I and II, and also the layer stacks II and III are connected to one another by means of a tunnel junction 5. By way of example, the tunnel junction 5 can comprise a highly doped layer of the first conductivity type and a highly doped layer of the second conductivity type. An efficient tunnel junction having an electrical junction resistance that is low during operation can be formed in this way.

By virtue of the arrangement of the three active layers 31, 32 and 33 in the LED semiconductor body 1, the amount of radiation generated overall is advantageously increased. Since the dimensions of the LED semiconductor body 1 change only inconsequentially in comparison with an LED semiconductor body having only a single active layer and, in particular, the luminous area of the LED semiconductor body 1 is independent of the number of active layers, more extensively the luminance is also advantageously increased.

The semiconductor body 1 is applied on a carrier element 9. A reflection layer 8 is preferably arranged between the carrier element 9 and the semiconductor body 1. Particularly preferably, both the reflection layer 8 and the carrier element 9 are electrically conductive. More extensively, the carrier element 9 is provided with a rear side contact 11 on a side remote from the semiconductor body 1. A front side contact 10 is correspondingly formed on a side of the LED semiconductor body 1 opposite to the carrier element 9. A vertically conductive component distinguished by a comparatively homogeneous current distribution within the LED semiconductor body 1 is thus formed.

The LED semiconductor body 1 is grown on a separate growth substrate and subsequently mounted onto the carrier element 9, for example by means of soldering, bonding or adhesive bonding, the growth substrate preferably being detached from the LED semiconductor body 1. The reflection layer 8 can be embodied for example as a Bragg mirror, a metallic layer or a composite of a metallic layer and a TCO layer, wherein the TCO layer can contain indium tin oxide or zinc oxide, for example. Furthermore, the reflection layer 8 can be embodied as a composite of a metallic layer and a structured layer, wherein the structured layer contains in particular an electrically insulating material, for example a silicon nitride or a silicon oxide, and has in particular openings that are preferably filled with the material of the metallic layer. Radiation portions that are emitted in the direction of the carrier element 9 can thus be reflected in the direction of a radiation coupling-out side.

On the radiation coupling-out side, the LED semiconductor body 1 has a photonic crystal 6 for increasing the radiation efficiency or the luminance. The photonic crystal 6 has first regions 6a having a first refractive index and second regions 6b having a second refractive index. While the second regions 6b are preferably formed from a semiconductor material used for the semiconductor body 1, the regions 6a are inserted as depressions into a semiconductor layer disposed downstream of the layer 43 of the second conductivity type. The depressions can be unfilled or filled with air, or alternatively be filled with a filling material having, in particular, a refractive index different from that of the semiconductor material. In the case of this exemplary embodiment, the second regions 6b are connected. Furthermore, the first regions 6a are surrounded by the second regions 6b. The first regions 6a are embodied in cylindrical fashion. However, the invention is not restricted to this form. The first regions 6a are arranged regularly in the semiconductor layer, such that a two-dimensional lattice results on account of this arrangement.

The invention is not restricted by the description on the basis of the exemplary embodiment. Rather, the invention encompasses any new feature and also any combination of features, which in particular comprises any combination of features in the patent claims, even if this feature or this combination itself is not explicitly specified in the patent claims or the exemplary embodiment.

The invention claimed is:

1. An LED (light emitting diode) semiconductor body comprising:
   a first radiation-generating active layer;
   a second radiation-generating active layer; and
   a photonic crystal,
   wherein the first active layer and the second active layer generate radiation having the same wavelength.

2. The LED semiconductor body as claimed in claim 1, wherein the photonic crystal has a plurality of first regions having a first refractive index and a plurality of second regions having a second refractive index.

3. The LED semiconductor body as claimed in claim 2, wherein the first and second regions are arranged regularly.

4. The LED semiconductor body as claimed in claim 2, wherein the first and second regions form a 1-dimensional, 2-dimensional or 3-dimensional lattice.

5. The LED semiconductor body as claimed in claim 2, wherein the second regions are connected to one another.

6. The LED semiconductor body as claimed in claim 2, wherein the first regions are surrounded by the second regions.

7. The LED semiconductor body as claimed in claim 2, wherein the first regions are filled or unfilled depressions in a semiconductor layer of the LED semiconductor body.

8. The LED semiconductor body as claimed in claim 7, wherein the first regions have a width and/or depth of between 100 nm and 500 nm.

9. The LED semiconductor body as claimed in claim 1, wherein the first active layer and the second active layer are arranged one above the other in a vertical direction.

10. The LED semiconductor body as claimed in claim 1, wherein the first active layer and the second active layer are monolithically integrated in the semiconductor body.

11. The LED semiconductor body as claimed in claim 1, further comprising a carrier element, wherein the LED semiconductor body element is arranged on the carrier element.

12. The LED semiconductor body as claimed in claim 11, wherein the carrier element is electrically conductive.

13. The LED semiconductor body as claimed in claim 11, wherein the carrier element is different from a growth substrate for the LED semiconductor body.

14. The LED semiconductor body as claimed in claim 13, wherein the growth substrate has been removed from the semiconductor body.

15. The LED semiconductor body as claimed in claim 11, further comprising a reflection layer arranged between the LED semiconductor body element and the carrier element, the reflection layer for reflecting radiation generated in the LED semiconductor body element in a direction of the photonic crystal.

16. The LED semiconductor body as claimed in claim 15, wherein the reflection layer comprises at least one of the materials Au, Al, Zn and/or Ag.

17. The LED semiconductor body as claimed in claim 15, wherein the reflection layer comprises a transparent conductive oxide (TCO).

18. The LED semiconductor body as claimed in claim 15, wherein the reflection layer is electrically conductive.

19. The LED semiconductor body as claimed in claim 15, wherein the reflection layer comprises a silicon nitride or silicon oxide.

20. The LED semiconductor body as claimed in claim 15, wherein the photonic crystal is arranged between the reflection layer and the LED semiconductor body element.

21. The LED semiconductor body as claimed in claim 11, wherein the photonic crystal is arranged on a side of the LED semiconductor body element that is remote from the carrier element.

22. The LED semiconductor body as claimed in claim 1, further comprising a tunnel junction between the first active layer and the second active layer.

23. The LED semiconductor body as claimed in claim 22, wherein the tunnel junction comprises a highly doped layer of a first conductivity type and a highly doped layer of a second conductivity type.

24. The LED semiconductor body as claimed in claim 1, wherein the first active layer and/or the second active layer comprises $Al_nGa_mIn_{1-n-m}P$, where $0 \leq n \leq 1$, $0 \leq m \leq 1$ and $n+m \leq 1$.

25. The LED semiconductor body as claimed in claim 1, wherein the first active layer and/or the second active layer comprises $Al_nGa_mIn_{1-n-m}As$, where $0 \leq n \leq 1$, $0 \leq m \leq 1$ and $n+m \leq 1$.

26. The LED semiconductor body as claimed in claim 1, wherein the first active layer and/or the second active layer comprises $Al_nGa_mIn_{1-n-m}N$, where $0 \leq n \leq 1$, $0 \leq m \leq 1$ and $n+m \leq 1$.

27. The LED semiconductor body as claimed in claim 1, wherein the semiconductor body emits radiation in a vertical direction.

28. The LED semiconductor body as claimed in claim 27, wherein the emission angle is $\alpha \leq 30°$.

29. The LED semiconductor body as claimed in claim 1, wherein the LED semiconductor body is a thin-film semiconductor body.

30. An LED (light emitting diode) semiconductor body comprising:
 a first radiation-generating active layer configured to generate radiation at a first wavelength;
 a second radiation-generating active layer overlying the first radiation-generating active layer in a vertical direction that is perpendicular to a main extension direction of the first and second active layers, the second radiation-generating active layer configured to generate radiation at the same first wavelength; and
 a photonic crystal overlying the first and second radiation-generating active layers.

31. The LED semiconductor body as claimed in claim 30, further comprising a third radiation-generating active layer, wherein the photonic crystal overlies the third radiation generating active layer.

* * * * *